United States Patent [19]
Aviram et al.

[11] Patent Number: 5,908,732
[45] Date of Patent: Jun. 1, 1999

[54] POLYMER COMPOSITIONS FOR HIGH RESOLUTION RESIST APPLICATIONS

[75] Inventors: Ari Aviram, Croton-on-Hudson; Karen Elizabeth Petrillo, Mahopac, both of N.Y.; Andrew T. S. Pomerene, New Fairfield, Conn.; David Earle Seeger, Congers, N.Y.

[73] Assignee: International Business Machines Corporation, Armonk, N.Y.

[21] Appl. No.: 08/717,644

[22] Filed: Sep. 23, 1996

[51] Int. Cl.⁶ .................. G03F 7/30; G03F 7/32; G03F 7/38

[52] U.S. Cl. ............ 430/296; 430/326; 430/966; 430/967; 430/942

[58] Field of Search .................... 430/296, 326, 430/966, 967, 942

[56] References Cited

U.S. PATENT DOCUMENTS 4,262,082  4/1981  Rosenkranz .................. 430/296
5,506,088  4/1996  Nozaki et al. .................. 430/270.1

FOREIGN PATENT DOCUMENTS 0 674 224 A1  9/1995  European Pat. Off. ........ G03F 7/023
0 702 271 A1  3/1996  European Pat. Off. ........ G03F 7/039

OTHER PUBLICATIONS

Sharma et al, Polymer, 1984, vol. 25, Aug. 1984 pp. 1090–1092.
RN 25249–16–5, Registry Copyright 1997 ACS, Computer printout, 1 page.
Bohumil Bednar et al, *Resists in Microlithography and Printing*, Materials Science Monographs: 76, 2nd revised Ed, Elsevier, Amsterdam, 1993, pp. 84–86.

*Primary Examiner*—Cynthia Hamilton
*Attorney, Agent, or Firm*—Pollock, Vande Sande & Amernick; Daniel P. Morris

[57] ABSTRACT

Positive lithographic patterns are produced by imagewise exposing to actinic light, x-ray or e-beam copolymers of 2-hydroxyalkyl methacrylate and/or 2-hydroxyalkyl acrylate with alkylmethacrylate and/or alkylacrylate, and then developing the polymer in a developer.

40 Claims, 2 Drawing Sheets

P—COOH + NR$_3$ $\longrightarrow$ P—COO$^\ominus$ ;NHR$_3^\oplus$

WATER INSOLUBLE             WATER SOLUBLE

POLYMER COMPOSITIONS FOR HIGH RESOLUTION RESIST APPLICATIONS

TECHNICAL FIELD

The present invention employs polymer compositions that when exposed to UV radiation below 240 nm, or soft x-rays, or e-beam, undergo a photochemical reaction that leads to the formation of carboxylic acid groups, which are base soluble. This photochemical reaction is very efficient and can be used for high resolution positive resists. The present invention is concerned with high sensitivity non-amplified positive working resists that are developable with bases, among them aqueous bases. It is also concerned with positive resist applications in x-ray and e-beam lithography.

BACKGROUND OF THE INVENTION

It is well known in the art that the photochemical formation of carboxylic acids, be it by amplified means such as a catalytic acidic-decomposition of a tertiary butyl ester, or as in the case of the photochemical decomposition of 1,2-naphthoquinone diazides, can be employed to produce high resolution and high efficiency resists. This type of reaction is being relied upon extensively in the production of positive working resists.

The manufacture of integrated circuits and other patterned devices relies primarily on resist materials that enable the formation of high resolution patterns. In the search for materials and methods for formation of patterns below 0.25 microns, it is recognized that such patterns require exposure sources based on UV radiation below 248 nm, or on x-ray, or on e-beams. Likewise, it is essential to employ resist materials suitable for use with short wavelengths sources. In the case of UV radiation, it might be convenient to use excimer laser sources that produce radiation at 193 nm.

An example of a positive resist suitable for short wavelength (193 nm) applications is the amplified resist described in the Journal of Vacuum Science and Technology B9 (6), p3357 (1991), by R. D. Allen et al., and also in U.S. Pat. No. 5,071,730, which describes a terpolymer based on a methacrylate backbone containing tertiary butyl esters, methyl esters and unesterified carboxylic acids side chains. Resist formulations also contain photoacid generating groups that decompose during the irradiation and cause a catalytic decomposition of the tertiary butyl esters groups, resulting in additional free carboxylic acid groups in imaged areas. These can be dissolved faster than the unexposed polymer with dilute aqueous bases. However, due to the existence of free carboxylic acid groups in non-imaged areas, the selectivity of the development is somewhat compromised.

U.S. Pat. No. 5,212,047 by Walter R. Hertler et al., assigned to E. I. Du Pont de Nemours and Co. describes another amplified resist material that provides excellent resolution and sensitivity. The composition involves polymers having recurring pendant acid labile α-alkoxyalkyl carboxylic acid ester moieties in the presence of an acid generator activated by UV, visible, x-ray or e-beam radiation. The mode of operation of this resist is similar to other amplified resists that use acid labile groups and is well known in the art.

It is well known in the art that poly(methyl methacrylate) (PMMA) undergoes main chain scission with a low quantum yield of 0.04 to 0.14, depending on the intensity and wavelength of the radiation. Side chain scission with a minute quantum yield of $10^{-6}$ has also been reported, but is too inefficient for practical resist applications. The reported photochemistry of PMMA and its analogues, leads to solvent developable positive images and relatively low efficiency lithography. (Wayne M. Moreau, Semiconductor Lithography, p 59, Plenum Press, NY 1988).

Japanese Laid-Open Patent Application (Kodai) No. 1-244447, Sep. 28, 1989 by Nakase et al., assigned to Toshiba Corp., suggests that films of poly(2-hydroxyethyl methacrylate) and poly(2-hydroxypropyl methacrylate) can be used for pattern formation, particularly with e-beams, and developed with isopropyl acetate, an organic solvent. The mode of development of patterns therein suggests that the scission products are expected to behave in the normal mode attributable to the majority of poly acrylic and methacrylic esters, namely main chain scission.

C. F. Vernon et al. reported (Polymer International, 27, 243 (1992)), that poly(2-hydroxyethyl methacrylate) undergoes ablation when exposed with excimer laser radiation at 193 nm. They suggested that at high radiation fluxes (>280 mJ/sq.cm.) main chain scission occurs while at low fluxes, scission of the entire side chain (2-hydroxyethoxycarbonyl) is obtained, with possible production of carbon dioxide.

U.S. Pat. No. 3,130,047 suggests that diazoquinone groups of sulfonyl esters of naphthoquinone-(1,2)-diazides can be converted photochemically to carboxylic acids that are soluble in aqueous alkali which in turn can cause solubilization of resins that contain these molecules. Suitable developers for the resists described therein include aqueous solutions of alkali metals or non-metallic bases such as tetramethyl ammonium hydroxide.

SUMMARY OF INVENTION

The present invention is directed to certain copolymers of 2-hydroxyalkylacrylates and/or 2-hydroxyalkylmethacrylates with an alkyl acrylate and/or alkyl methacrylate. In particular, the copolymers of the present invention are positive photoresists from monomers consisting essentially of about 75 to about 95 weight percent of the 2-hydroxyalkylacrylate and/or 2-hydroxyalkylmethacrylate and correspondingly about 5 to about 25 weight percent of an alkyl acrylate and/or methacrylate.

The present invention is also concerned with a process for producing a positive lithographic pattern on a substrate comprising providing on the substrate a coating of a copolymer of 2-hydroxyalkylacrylates and/or 2-hydroxyalkylmethacrylates, with an alkyl acrylate and/or alkyl methacrylate.

The polymer is selectively imagewise exposed to actinic light. The lithographic pattern is developed by contacting the exposed polymer with a developer to thereby remove the portions of the polymer exposed to the actinic light.

BEST AND VARIOUS MODES FOR CARRYING OUT INVENTION

Figure 1:
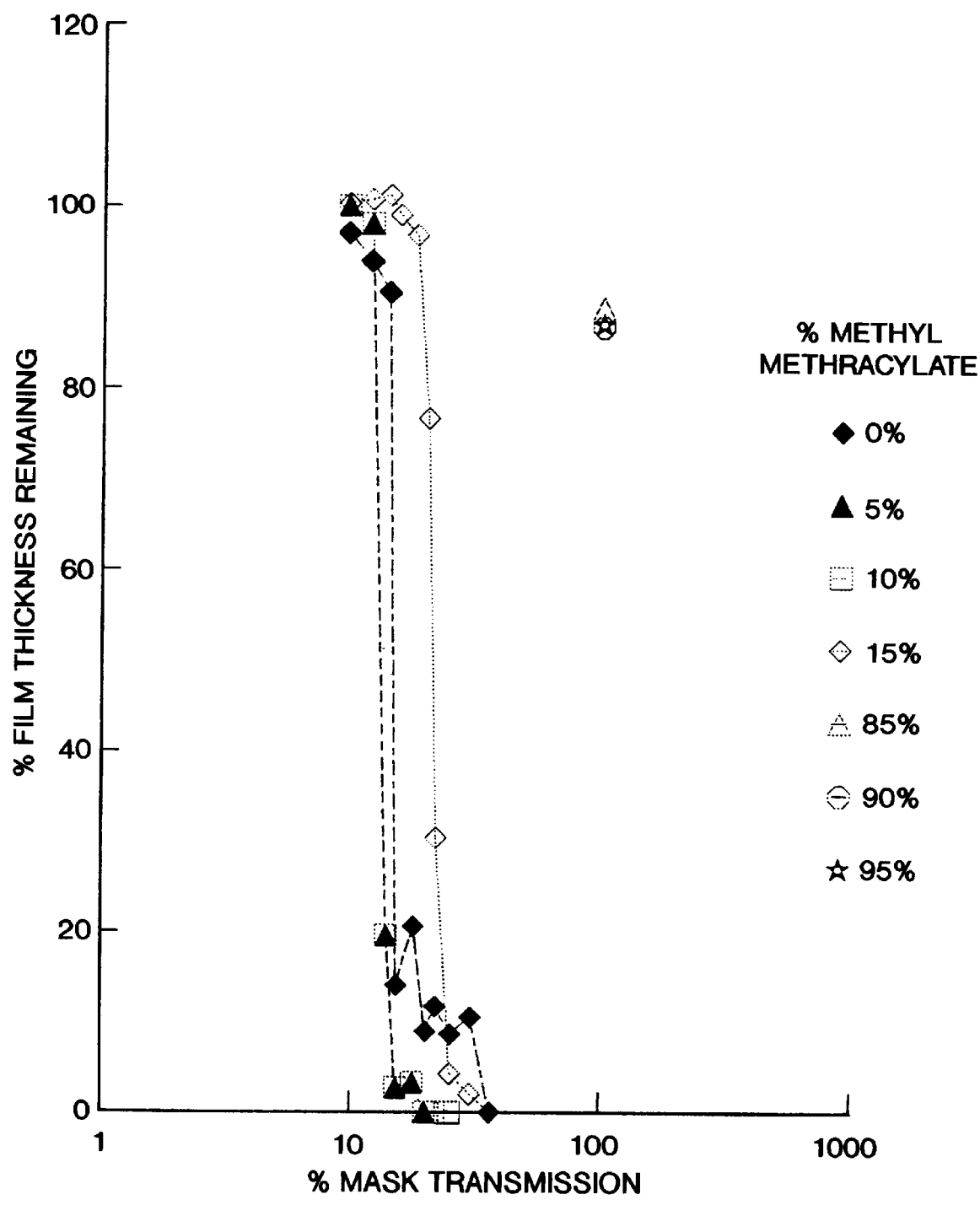
FIG. 1 illustrates contrast curves obtained employing copolymers according to the present invention.

According to the present invention, actinic light, such as deep UV irradiation with wavelengths below 240 nm; x-ray or e-beam, is used to expose certain copolymers of (2-hydroxyalklyl acrylates) and/or of (2-hydroxyalkyl methacrylates) to deesterify side chain pendant groups leading to free carboxylic group.

This process occurs with high photo-efficiency. There is no need for any special additives to catalyze the reaction or any thermal treatment during or after the exposure. Furthermore, the resulting photo-products are soluble in aqueous bases, a highly desirable feature for a practical resists. That radiation of the polymers employed in the present invention produces free pendant carboxylic acid groups alone product polymeric chains is surprising and in contrast to previous reports, as described in the prior art.

The polymers of the present invention are copolymers from monomers consisting essentially of:

1) $CH_2CHCOOCH_2CHOH(CH_2)_nH$ and/or $CH_2C(CH_3)CHOOCH_2CHOH(CH_2)_nH$; wherein n=0 to 10; and
2) $CH_2CHCOO(CH_2)_nH$ and/or $CH_2C(CH_3) COO(CH_2)_nH$; wherein n=1 to 10. The amount of 1) is about 75 to about 95, preferably about 80 to about 90, and most preferably about 84 to about 87 wt. %; and the amount of 2) is about 5 to about 25, preferably about 10 to about 20 and most preferably about 13 to about 16 wt. %. These weight percents are based upon the total weight of 1) and 2).

The copolymers of the present invention are copolymers of 2-hydroxyalkyl methacrylate and/or 2-hydroxyalkyl acrylate with alkylacrylate and/or alkylmethacrylate. As used in describing the resins which may be used in this invention, the term alkyl in the ester moiety refers to a straight or branched chain hydrocarbon having from 1 to 10 carbon atoms and containing no unsaturation. Specific copolymers suitable for purposes of the present invention are: copolymers of 2-hydroxyethyl methacrylate and methylmethacrylate; copolymers of 2-hydroxypropyl methacrylate and methylmethacrylate; copolymers of 2-hydroxyethyl methacrylate and t-butylmethacrylate; copolymers of 2-hydroxypropyl methacrylate and t-butylmethacrylate; copolymers of 2-hydroxyethyl acrylate and t-butylmethacrylate: copolymers of 2-hydroxypropyl acrylate and t-butylmethacrylate; copolymers of 2-hydroxyethyl methacrylate and methacrylate; copolymers of 2-hydroxypropyl methacrylate and methylacrylate; copolymers of 2-hydroxyethyl acrylate and methylmethacrylate; copolymers of 2-hydroxypropyl acrylate and methylmethacrylate; copolymers of 2-hydroxyethyl acrylate and methylacrylate; copolymers of 2-hydroxypropyl acrylate and methylacrylate; copolymers of 2-hydroxypropyl acrylate and methylacrylate; copolymers of 2-hydroxybutyl methacrylate and methylmethacrylate; copolymers of 2-hydroxypentyl methacrylate and methylmethacrylate; copolymers of 2-hydroxybutyl acrylate and methylmethacrylate; and copolymers of 2-hydroxypentyl acrylate and methylmethacrylate.

The polymers of the present invention typically have weight average molecular weight of about $10^4$ to about $10^6$, more typically about 50,000 to about 600,000, an example being about 300,000. The polymers typically have Tg of up to about 70° C. The polymers are prepared by polymerization of the selected relative amount of monomers in an organic diluent such as isopropanol or tetrahydrofuran under reflux in a nitrogen atmosphere for about 24 hours in the presence of about 0.4% by weight of a free radical catalyst such as azoisobutyricdinitrile. The relative amount of organic diluent typically being about 20 to about 100 parts by weight per 1 part by weight of the monomers.

The polymer in the case of isopropanol is then precipitated out of solution by adding about 1 part by weight of water per 1 part of the isopropanol and then dried. In the case of tetrahydrofuran, the polymer is obtained by evaporating off the tetrahydrofuran, followed by dissolving in an alcohol such as isopropanol and then precipitating the polymer by adding water. The amount of alcohol and water typically being about 20 to about 100 parts by weight per 1 part of the starting monomers.

Although homopolymers of β-hydroxyalkylmethacrylate, such as poly(2C-hydroxyethyl methacrylate), display the same photochemistry as the copolymers of the present invention, it was found advantageous to use these copolymers in order to minimize the possible water absorption of the non-irradiated regions of the resist film. Such absorption can lead to swelling, which in turn distorts the pattern, and diminishes resolution. A good example to this effect is comparison between poly(2-hydroxyethyl methacrylate) and poly(2-hydroxypropyl methacrylate). While the best resolution yielded by the first polymer was 0.50 µm, under identical conditions, the hydroxyl propyl polymer yielded resolution of 0.125 µm. This can be attributed to a higher hydrophobicity of the second polymer.

In order to control the hydrophobicity, the present invention employs copolymers where the alkyl functionality is introduced for the specific purpose of expelling water from the polymer matrix, thus blending the photochemical properties and the water absorption properties.

The use of the homopolymers is disclosed in copending application Ser. No. 08/700,348, filed Sep. 23, 1996, entitled A High Sensitivity, Photo-Active Polymer and Developers for High Resolution Resist Applications. (Docket YO 996 038), disclosure of which is incorporated herein by reference.

Typical film thicknesses of the compositions are about 0.3 to about 1 microns and more typically about 0.5 to about 0.8 microns (dry).

The polymer can be dissolved in an organic solvent such as dimethylformamide. perfluoroisopropanol or 1-methyl-2-pyrrolidinone. The solution can then be coated on to the desired substrate, such as by spin casting. Preferred substrates are those used in fabricating integrated circuits.

The polymeric film is then imagewise exposed to actinic light to contact selected portions of the film without exposing the other portions of the film. Preferably, the actinic light employed is deep UV (i.e., wavelengths of 193 nm and below), x-rays or e-beam. The light absorption at 248 nm is significantly lower than at 200 nm, thus, unless properly sensitized, the β-hydroxy esters will decompose only at wavelengths lower than 240 nm, thus making the materials suitable for the 193 nm lithography.

The high efficiency of the photochemical reaction makes possible the use of the polymers required by the present invention for non-amplified resists.

The non-amplified polymeric resists employed according to the present invention, after exposure, is then developed to provide the desired pattern. The developer can be an aqueous base such as ammonium hydroxide, tetramethyl ammonium hydroxide or pyridine. Suitable ammonium hydroxide compositions contain up to about 27% by weight and preferably about 5 to about 10% by weight. A suitable tetramethylammonium hydroxide composition is a 0.26 N solution (AZ-300). An example of a pyridine developer is a 5% aqueous solution.

Moreover, improved images with increased resolution can be achieved employing the preferred developers and methods as will be described hereinbelow that are disclosed in copending application Ser. No. 08/700,348 (Docket YO 996 038). More specifically involved are two developers and development methods. The first method relies on aqueous solutions of certain organic materials. The other is an amine vapor developer employed by a specific technique.

METHOD 1

The developers that can be employed are aqueous solutions of about 0.001% to about 1% by weight of a compound containing at least one amino group, preferably two or more amine groups, and at least two sulfonate groups selected from the group consisting of alkali metal sulfonate, ammonium sulfonate group and mixtures thereof. Contact with these developers removes the portions of the polymeric material exposed to the actinic light.

The developers are amphoteric materials and include both monomeric and polymeric materials.

Examples of specific developers are:

1. CONGO RED C.I. No. 22120

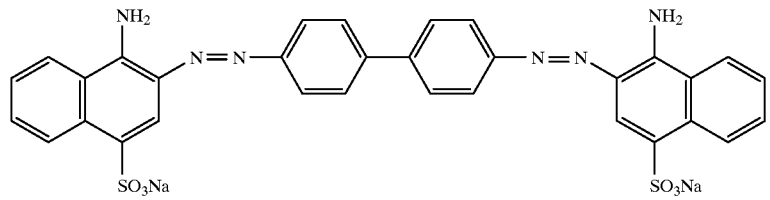

2. FLUORESCENT BRIGHTENER #28 C.I. No. 40622

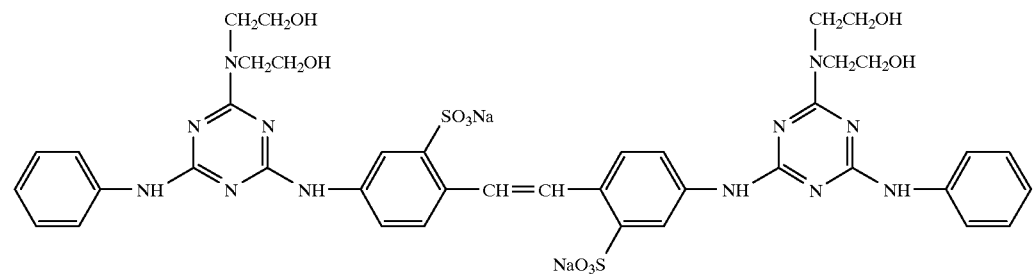

3. 1,4-Pipearazinediethanesulfonate disodium salt (Sodium pipesate)

The developer can include additives such as added surfactants such as poly (sodium styrene sulfonate). When present, such is typically used in amounts of about 0.1 to about 0.5 weight percent.

METHOD 2

According to another technique, an amine developer in gaseous or vapor form is employed followed by contact with water or an aqueous solvent. The contact with the amine converts free carboxylic acid groups to ammonium carboxylate groups. Free amine is then removed. The water or aqueous solvent extracts or removes those portions of the polymeric material exposed to the actinic light.

Figure 2:
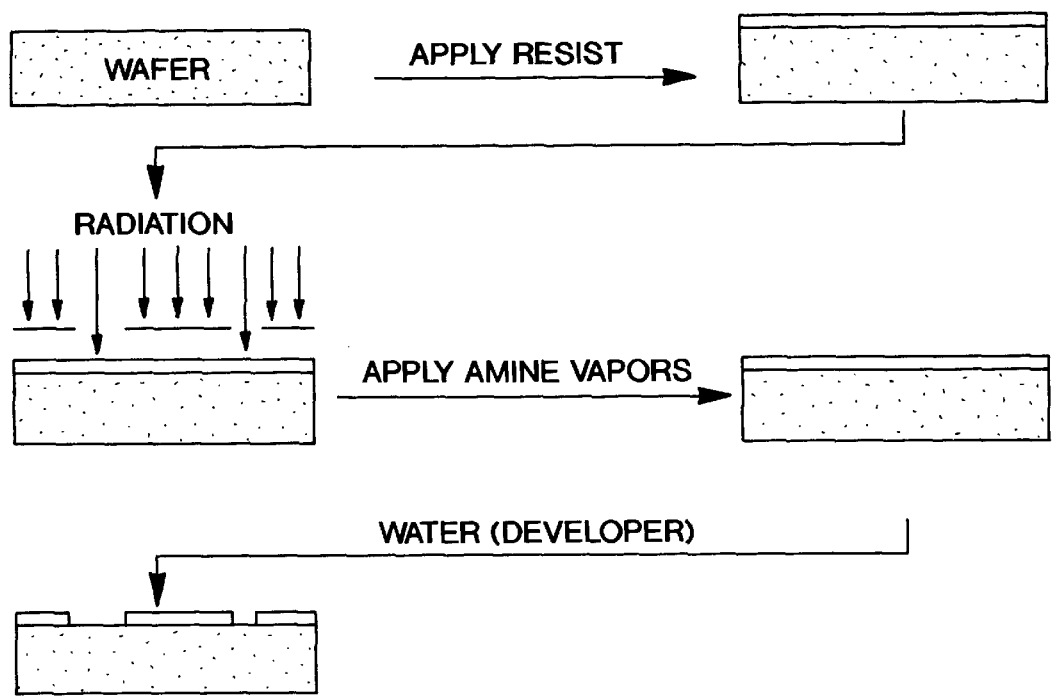
FIG. 2 is a flow chart of the amine developing process that can be used in the present invention.

More particularly, when a polymeric film that has been imagewise addressed is exposed to the amine vapors, these penetrate into the film and react with the carboxylic acid groups in the exposed areas. The film is then heated or placed in vacuum to expel excess unreacted amine and immersed into water or alcohol containing water, to solubilize the ammonium carboxylate containing polymer. A flow chart of the amine process is shown in FIG. 2.

Preferred amines are tertiary amines of the general formula:

$NR_1R_2R_3$ wherein each of $R_1$, $R_2$ and $R_3$ is $C_nH_{2n+1}$ or $C_6H_5$ and n=1–8; and of the general formula: N,N'-tetra-R-diamino-$C_mH_{2m}$ where $R=C_nH_{2n+1}$ and where n=1–4 and m=1–8.

Examples of suitable amines are:

N,N'-tetramethyl-ethylene diamine
N,N'-tetraethyl-ethylene diamine
N,N'-tetrapropyl-ethylene diamine
N,N'-tetrabutyl-ethylene diamine The following non-limiting examples are presented to further illustrate the present invention.

EXAMPLE 1

12.5 g of a copolymer of 2-hydroxyethyl methacrylate, 85 wt. % and methylmethacrylate 15 wt. % are dissolved in 87.5 g 1-methyl-2-pyrrolidinone. The solution is spin coated onto a silicon wafer at 3000 RPM and given a post applied bake (PAB) of about 2 minutes at about 100° C. The resulting film is 0.8 micrometer thick. The film is exposed through a patterned mask with a narrow band UV lamp that has an output at 185–195 nm, and given a dose of 70 mJ/sq.cm. The image is developed with a solution of 0.1 wt. % congo red in water for ten minutes, resulting in a positive image.

EXAMPLE 2

12.5 g of a copolymer of 2-hydroxypropyl methacrylate, 90 wt. % and methylmethacrylate 10 wt. % are dissolved in 87.5 g 1-methyl-2-pyrrolidinone. The solution is spin coated onto a silicon wafer at 3000 RPM and given a post applied bake (PAB) of about 2 minutes at about 100° C. The resulting film is about 0.8 micrometer thick. The film is exposed through a patterned mask with a narrow band UV lamp that has an output at 185–195 nm, and given a dose of 70 mJ/sq.cm. The image is developed with a solution of 0.1 wt. % congo red in water for ten minutes, resulting in a positive image.

EXAMPLE 3

A film of a copolymer of 2-hydroxyethyl methacrylate, 85 wt. % and methylmethacrylate 15 wt. % is prepared as described in Example 1 and exposed with 70 mJ/sq.cm. x-ray radiation through an appropriate mask. The film is developed with 0.1 wt. % solution of congo red in water for ten minutes. A positive image is obtained.

EXAMPLE 4

A film of copolymer of 2-hydroxyethyl methacrylate, 85 wt. % and methylmethacrylate 15 wt. % is prepared as described in Example 2 and exposed to 30 $\mu$C e-beam radiation at 100 kv. The image is developed with a solution of 0.1 wt. % of congo red in water for ten minutes. A positive image is obtained with line resolution of 0.252 $\mu$m.

EXAMPLE 5

A film of copolymer of 2-hydroxyethyl methacrylate, 15 wt. % and methylmethacrylate 85 wt. % is prepared as in Example 1 and exposed to 30 $\mu$C electron beam at 100 kv to form a pattern. The wafer is developed with a solution of 40 wt. % of 2-(2-butoxyethoxy) ethanol and 60 wt. % water for eight minutes. A positive image is obtained with line resolution of 0.25 $\mu$m. is obtained.

EXAMPLE 6

A solution of 10 wt. % of copolymer of 2-hydroxyethyl methacrylate 87% and t-butyl methacrylate 13%, in 1-methyl-2-pyrrolidinone is prepared and coated onto a Si wafer by spin coating. The wafer is baked for 2 minutes at 100° C. and exposed by e-beam at 30 $\mu$C. The wafer is placed into a solution of 0.1 wt. % congo red for 10 minutes. A positive pattern is obtained.

EXAMPLE 7

A solution of 10 wt. % of copolymer of 2-hydroxyethyl methacrylate 90% and t-butyl methacrylate 10%, in 1-methyl-2-pyrrolidinone is prepared and coated onto a Si wafer by spin coating. The wafer is baked for 2 minutes at 100° C. and exposed by e-beam at 30 $\mu$C. The wafer is placed into a solution of 0.1 wt. % congo red for 10 minutes. A positive pattern is obtained.

EXAMPLE 8

A solution of 10 wt. % of copolymer of 2-hydroxyethyl methacrylate 87% and t-butyl methacrylate 13%, in 1-methyl-2-pyrrolidinone is prepared and coated onto a Si wafer by spin coating. The wafer is baked for 2 minutes at 100° C. and exposed by x-ray at 100 mJ/sq.cm. The wafer is placed into a solution of 0.1 wt. % congo red for 10 minutes. A positive pattern is obtained.

EXAMPLE 9

A film of a copolymer of 85 wt. % 2-hydroxyethyl methacrylate and 15 wt. % methyl methacrylate is prepared as in Example 2 and exposed to 8 $\mu$C electron beam at 100 kv to form a pattern. The wafer is developed with a solution of 0.1 wt. % of congo red for eight minutes. A positive image is obtained.

The foregoing embodiments are merely examples of many other possible embodiments of this invention. Many other differing variations within the spirit and scope thereof have not been included and it should not be understood that this invention is limited to the specific embodiments exemplified except as defined by the following claims:

What is claimed is:

1. A process for providing a positive lithographic pattern on a substrate which comprises:
    a) providing on said substrate a film of a copolymer from
        1) 2-hydroxyethyl methacrylate; and
        2) t-butyl methacrylate; and wherein the amount of 1) is about 75 to about 95 weight % and the amount of 2) is correspondingly about 5 to about 25 weight % being based upon the total weight of 1) and 2);
    b) imagewise exposing said film to actinic light, x-rays or e-beam; and
    c) developing said lithographic pattern by contacting said polymer with a developer to thereby remove the portions of said polymer exposed to said actinic light, x-rays or e-beam.

2. The process of claim 1 wherein said developer is an aqueous solution of a material selected from the group consisting of ammonium hydroxide, tetramethyl ammonium hydroxide and pyridine.

3. The process of claim 1 wherein said developer is an aqueous developer solution of about 0.001% to about 1% by weight of a compound containing at least one amino group and at least two sulfonate groups selected from the group consisting of alkali metal sulfonate group, ammonium sulfonate group and mixtures thereof.

4. The process of claim 3 wherein said compound is congo red.

5. The process of claim 3 wherein said compound is fluorescent brightener #28.

6. The process of claim 3 wherein said compound is sodium pipesate.

7. The process of claim 1 which comprises developing said lithographic pattern by exposing said polymeric material to an amine in vapor form thereby converting free carboxylic acid groups to ammonium carboxylate groups; removing free amine; and contacting said polymeric material with an aqueous solvent to thereby remove the portions of said polymeric material exposed to said actinic light, x-rays or e-beam.

8. The process of claim 7 wherein said amine has the general formula:

wherein each of $R_1$, $R_2$ and $R_3$ is $C_nH_{2n+1}$ or $C_6H_5$ and n=1–8.

9. The process of claim 7 wherein said amine is of the general formula:

N,N'-tetra-R-diamino-$C_mH_{2m}$ where $R=C_nH_{2n+1}$ and where n=1–4 and m=1–8.

10. The process of claim 7 wherein the amine is N,N'-tetramethyl-ethylene diamine.

11. The process of claim 7 wherein the amine is N,N'-tetraethyl-ethylene diamine.

12. The process of claim 7 wherein the amine is N,N'-tetrapropyl-ethylene diamine.

13. The process of claim 7 wherein the amine is N,N'-tetrabutyl-ethylene diamine.

14. A process for providing a positive lithographic pattern on a substrate which comprises:
   a) providing on the substrate a film of a copolymer from
      1) at least one monomer selected from the group consisting of 2-hydroxyalkyl methacrylate; 2-hydroxy alkyl acrylate; and mixtures thereof wherein the alkyl has 2–12 carbon atoms; and
      2) at least one monomer selected from the group consisting of alkylacrylate; alkylmethacrylate; and mixtures thereof wherein the alkyl has 1–10 carbon atoms, and wherein the amount of 1) is about 75 to about 95 weight % and the amount of 2) is correspondingly about 5 to about 25 weight % being based upon the total weight of 1) and 2);
   b) imagewise exposing the film to actinic light, x-rays or e-beam; and
   c) developing said lithographic pattern by contacting the polymer with a developer to thereby remove the portions of the polymer exposed to the actinic light, x-rays or e-beam;
   wherein the developer is an aqueous solution of a material selected from the group consisting of ammonium hydroxide, tetramethyl ammonium hydroxide and pyridine.

15. The process of claim 14 wherein the copolymer is selected from the group consisting of copolymer of 2-hydroxyethyl methacrylate and methylmethacrylate; copolymer of 2-hydroxypropyl methacrylate and methylmethacrylate; copolymer of 2-hydroxyethyl methacrylate and methylacrylate; copolymer of 2-hydroxypropyl methylacrylate and methylmethacrylate; copolymer of 2-hydroxyethyl acrylate and methylmethacrylate; copolymer of 2-hydroxypropyl acrylate and methylmethacrylate; copolymer of 2-hydroxyethyl acrylate and methylacrylate; copolymer of 2-hydroxyethyl methacrylate and t-butylmethacrylate; copolymer of 2-hydroxypropyl methacrylate and t-butylmethylacrylate; copolymer of 2-hydroxyethyl acrylate and t-butylmethylmethacrylate; copolymer of 2-hydroxypropyl acrylate and t-butylmethylmethacrylate; copolymer of 2-hydroxyethyl acrylate and methylacrylate; copolymer of 2-hydroxybutyl methacrylate and methylmethacrylate; copolymer of 2-hydroxypentyl methacrylate and methylmethacrylate; copolymer of 2-hydroxybutyl acrylate and methylmethacrylate; and copolymer of 2-hydroxypentyl acrylate and methylmethacrylate and mixtures thereof.

16. The process of claim 14 wherein said copolymer is a copolymer of 2-hydroxyethyl methacrylate and methylmethacrylate.

17. The process of claim 14 wherein said actinic light is deep UV irradiation with wavelengths below 240 nm.

18. The process of claim 14 wherein x-ray irradiation is employed.

19. The process of claim 14 wherein e-beam irradiation is employed.

20. A process for providing a positive lithographic pattern on a substrate which comprises:
   a) providing on the substrate a film of a copolymer from
      1) at least one monomer selected from the group consisting of 2-hydroxyalkyl methacrylate; 2-hydroxy alkyl acrylate; and mixtures thereof wherein the alkyl has 2–12 carbon atoms; and
      2) at least one monomer selected from the group consisting of alkylacrylate; alkylmethacrylate; and mixtures thereof wherein the alkyl has 1–10 carbon atoms, and wherein the amount of 1) is about 75 to about 95 weight % and the amount of 2) is correspondingly about 5 to about 25 weight % being based upon the total weight of 1) and 2);
   b) imagewise exposing the film to actinic light, x-rays or e-beam; and
   c) developing said lithographic pattern by contacting the polymer with a developer to thereby remove the portions of the polymer exposed to the actinic light, x-rays or e-beam;
   wherein the developer is an aqueous solution of about 0.001% to about 1% by weight of a compound containing at least one amino group and at least two sulfonate groups selected from the group consisting of alkali metal sulfonate group, ammonium sulfonate group and mixtures thereof.

21. The process of claim 20 wherein the copolymer is selected from the group consisting of copolymer of 2-hydroxyethyl methacrylate and methylmethacrylate; copolymer of 2-hydroxypropyl methacrylate and methylmethacrylate; copolymer of 2-hydroxyethyl methacrylate and methylacrylate; copolymer of 2-hydroxypropyl methylacrylate and methylmethacrylate; copolymer of 2-hydroxyethyl acrylate and methylmethacrylate; copolymer of 2-hydroxypropyl acrylate and methylmethacrylate; copolymer of 2-hydroxyethyl acrylate and methylacrylate; copolymer of 2-hydroxyethyl methacrylate and t-butylmethacrylate; copolymer of 2-hydroxypropyl methacrylate and t-butylmethylacrylate; copolymer of 2-hydroxyethyl acrylate and t-butylmethylmethacrylate; copolymer of 2-hydroxypropyl acrylate and t-butylmethylmethacrylate; copolymer of 2-hydroxyethyl acrylate and methylacrylate; copolymer of 2-hydroxybutyl methacrylate and methylmethacrylate; copolymer of 2-hydroxypentyl methacrylate and methylmethacrylate; copolymer of 2-hydroxybutyl acrylate and methylmethacrylate; and copolymer of 2-hydroxypentyl acrylate and methylmethacrylate and mixtures thereof.

22. The process of claim 20 wherein the copolymer is a copolymer of 2-hydroxyethyl methacrylate and methylmethacrylate.

23. The process of claim 20 wherein the actinic light is deep UV irradiation with wavelengths below 240 nm.

24. The process of claim 20 wherein x-ray irradiation is employed.

25. The process of claim 20 wherein e-beam irradiation is employed.

26. The process of claim 20 wherein the compound is congo red.

27. The process of claim 20 wherein the compound is fluorescent brightener #28.

28. The process of claim 20 wherein the compound is sodium pipesate.

29. A process tor providing a positive lithographic pattern on a substrate which comprises:
   a) providing on said substrate a film of a copolymer from
      1) at least one monomer selected from the group consisting of 2-hydroxyalkyl methacrylate; 2-hydroxy alkyl acrylate; and mixtures thereof wherein the alkyl has 2–12 carbon atoms; and 2) at least one monomer selected from the group consisting of alkylacrylate; alkylmethacrylate; and mixtures thereof wherein the alkyl has 1–10 carbon atoms, and wherein the amount of 1) is about 75 to about 95 weight % and the amount of 2) is correspondingly about 5 to about 25 weight % being based upon the total weight of 1) and 2);

b) imagewise exposing the film to actinic light, x-rays or e-beam; and c) developing said lithographic pattern by contacting the polymer with a developer to thereby remove the portions of the polymer exposed to the actinic light, x-rays or e-beam;

wherein developing the lithographic pattern comprises exposing the polymeric material to an amine in vapor form thereby converting free carboxylic acid groups to ammonium carboxylate groups; removing free amine; and contacting the polymeric material with an aqueous solvent to thereby remove the portions of the polymeric material exposed to the actinic light, x-rays or e-beam.

30. The process of claim 29 wherein the amine has the general formula $NR_1R_2R_3$ wherein each of $R_1$, $R_2$ and $R_3$ is $C_nH_{2n+1}$ or $C_6H_5$ and n=1–8.

31. The process of claim 29 wherein the amine is of the general formula N,N'-tetra-R-diamino-$C_mH_{2m}$ where R=$C_nH_{2n+1}$ and where n=1–4 and m=1–8.

32. The process of claim 29 wherein the amine is N,N'-tetramethyl-ethylene diamine.

33. The process of claim 29 wherein the amine is N,N'-tetraethyl-ethylene diamine.

34. The process of claim 29 wherein the amine is N,N'-tetrapropyl-ethylene diamine.

35. The process of claim 29 wherein the amine is N,N'-tetrabutyl-ethylene diamine.

36. The process of claim 29 wherein the copolymer is selected from the group consisting of copolymer of 2-hydroxyethyl methacrylate and methylmethacrylate; copolymer of 2-hydroxypropyl methacrylate and methylmethacrylate; copolymer of 2-hydroxyethyl methacrylate and methylacrylate; copolymer of 2-hydroxypropyl methylacrylate and methylmethacrylate; copolymer of 2-hydroxyethyl acrylate and methylmethacrylate; copolymer of 2-hydroxypropyl acrylate and methylmethacrylate; copolymer of 2-hydroxyethyl acrylate and methylacrylate; copolymer of 2-hydroxyethyl methacrylate and t-butylmethacrylate; copolymer of 2-hydroxypropyl methacrylate and t-butylmethylacrylate; copolymer of 2-hydroxyethyl acrylate and t-butylmethylmethacrylate; copolymer of 2-hydroxypropyl acrylate and t-butylmethylmethacrylate; copolymer of 2-hydroxyethyl acrylate and methylacrylate; copolymer of 2-hydroxybutyl methacrylate and methylmethacrylate; copolymer of 2-hydroxypentyl methacrylate and methylmethacrylate; copolymer of 2-hydroxybutyl acrylate and methylmethacrylate; and copolymer of 2-hydroxypentyl acrylate and methylmethacrylate and mixtures thereof.

37. The process of claim 29 wherein the copolymer is a copolymer of 2-hydroxyethyl methacrylate and methylmethacrylate.

38. The process of claim 29 wherein the actinic light is deep UV irradiation with wavelengths below 240 nm.

39. The process of claim 29 wherein x-ray irradiation is employed.

40. The process of claim 29 wherein e-beam irradiation is employed.

* * * * *

UNITED STATES PATENT AND TRADEMARK OFFICE
CERTIFICATE OF CORRECTION

PATENT NO. : 5,908,732
DATED : June 1, 1999
INVENTOR(S) : Ari Aviram, et al.

Page 1 of 2

It is certified that error appears in the above-indentified patent and that said Letters Patent is hereby corrected as shown below:

On the title page, item [56] add the following:

U. S. PATENT DOCUMENTS

| EXAMINER INITIAL | | PATENT NUMBER | | | | | | ISSUE DATE | PATENTEE | CLASS | SUBCLASS | FILING DATE IF APPROPRIATE |
|---|---|---|---|---|---|---|---|---|---|---|---|---|
| | | 2 | 9 | 7 | 6 | 5 | 7 | 6 | 04/1956 | Wichterle et al. | | | |
| | | 3 | 2 | 2 | 0 | 9 | 6 | 0 | 11/1965 | Wichterle | | | |
| | | 3 | 5 | 3 | 5 | 1 | 3 | 7 | 10/1970 | Haller, et al. | | | |
| | | 3 | 6 | 2 | 0 | 7 | 2 | 6 | 11/1971 | Chu | | | |
| | | 3 | 6 | 6 | 9 | 6 | 6 | 0 | 06/1972 | Golda, et al. | | | |
| | | 3 | 7 | 5 | 8 | 4 | 4 | 8 | 11/1973 | Stamberger | | | |
| | | 4 | 0 | 1 | 1 | 3 | 5 | 1 | 03/1977 | Gipstein et al. | | | |
| | | 4 | 2 | 9 | 3 | 6 | 3 | 6 | 10/1981 | Okuya | | | |
| | | 4 | 3 | 5 | 5 | 0 | 9 | 3 | 10/1982 | Hartmann et al. | | | |
| | | 4 | 4 | 5 | 8 | 0 | 0 | 8 | 07/1984 | Konstantinov et al | | | |
| | | 4 | 6 | 5 | 2 | 6 | 0 | 4 | 03/1987 | Walls et al. | | | |
| | | 4 | 7 | 0 | 7 | 4 | 3 | 7 | 11/1987 | Walls et al. | | | |
| | | 4 | 8 | 0 | 6 | 4 | 5 | 0 | 02/1989 | Hofmann et al. | | | |
| | | 5 | 0 | 3 | 5 | 9 | 8 | 2 | 07/1991 | Walls | | | |
| | | 5 | 1 | 4 | 7 | 7 | 5 | 9 | 09/1992 | Ohtawa et al. | | | |
| | | 5 | 1 | 5 | 5 | 0 | 1 | 1 | 10/1992 | Zertani et al. | | | |
| | | 5 | 1 | 6 | 4 | 2 | 8 | 6 | 11/1992 | Blakeney et al. | | | |
| | | 5 | 2 | 0 | 0 | 2 | 9 | 1 | 04/1993 | Wanat | | | |
| | | 5 | 2 | 1 | 2 | 0 | 4 | 7 | 05/1993 | Hertler et al. | | | |
| | | 5 | 2 | 2 | 9 | 2 | 4 | 5 | 07/1993 | Lin | | | |
| | | 5 | 3 | 6 | 8 | 9 | 8 | 2 | 11/1994 | Suzuki et al. | | | |
| | | 5 | 3 | 7 | 4 | 5 | 0 | 0 | 12/1994 | Carpenter, Jr., et al | | | |
| | | 5 | 4 | 2 | 0 | 1 | 7 | 1 | 05/1995 | Unruh | | | |

UNITED STATES PATENT AND TRADEMARK OFFICE
CERTIFICATE OF CORRECTION

PATENT NO. : 5,908,732
DATED : June 1, 1999
INVENTOR(S) : Ari Aviram, et al.

It is certified that error appears in the above-indentified patent and that said Letters Patent is hereby corrected as shown below:

FOREIGN PATENT OR PUBLISHED FOREIGN PATENT APPLICATION

| | | DOCUMENT NUMBER | | | | | | PUBLICATION DATE | COUNTRY OR PATENT OFFICE | CLASS | SUBCLASS | TRANSLATION YES | NO |
|---|---|---|---|---|---|---|---|---|---|---|---|---|---|
| | 6 | 3 | - | 6 | 9 | 7 | 8 | 6 | 09/1989 | Japan | | | | |

OTHER (Including Author, Title, Date, Pertinent Pages, etc.)

| |
|---|
| Method to Remove Positive Photoresist Stains from Garments, March 1991, Research Disclosure n434-03-91 |
| Tadao et al., Photoengraving Method, Jap. 62-264053, 1987, Abstract |

Signed and Sealed this

Twenty-sixth Day of October, 1999

Attest:

Q. TODD DICKINSON

Attesting Officer

Acting Commissioner of Patents and Trademarks